United States Patent
Chen et al.

(10) Patent No.: US 8,754,709 B2
(45) Date of Patent: Jun. 17, 2014

(54) DOHERTY POWER AMPLIFIER AND IMPLEMENTATION METHOD THEREOF

(75) Inventors: Huazhang Chen, Shenzhen (CN); Jianli Liu, Shenzhen (CN); Xiaojun Cui, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 0 days.

(21) Appl. No.: 13/513,797

(22) PCT Filed: Oct. 27, 2011

(86) PCT No.: PCT/CN2011/081383
§ 371 (c)(1),
(2), (4) Date: Jun. 4, 2012

(87) PCT Pub. No.: WO2012/146002
PCT Pub. Date: Nov. 1, 2012

(65) Prior Publication Data
US 2014/0035677 A1    Feb. 6, 2014

(30) Foreign Application Priority Data

Apr. 29, 2011  (CN) .......................... 2011 1 0110331

(51) Int. Cl.
*H03F 3/68*  (2006.01)
(52) U.S. Cl.
USPC .......................... 330/295; 330/51; 330/124 R
(58) Field of Classification Search
USPC ....................................... 330/295, 51, 124 R
IPC ........................................................ H03F 3/68
See application file for complete search history.

(56) References Cited

U.S. PATENT DOCUMENTS 6,791,417 B2 * 9/2004 Pengelly et al. .............. 330/295
6,982,593 B2 * 1/2006 Robinson et al. ............... 330/10
(Continued)

FOREIGN PATENT DOCUMENTS

CN   102185568 A   9/2011
GB   2437573 A    10/2007
(Continued)

OTHER PUBLICATIONS

Craig Steinbeiser 250W HVHBT Doherty with 57% WCDMA Efficiency Linearized to -55dBc, IEEE Journal of Solid-State Circuits, Oct. 2008.

(Continued)

*Primary Examiner* — Patricia Nguyen
(74) *Attorney, Agent, or Firm* — Ling Wu; Stephen Yang; Ling and Yang Intellectual Property

(57) ABSTRACT

The present invention discloses a Doherty power amplifier and a method for implementing the Doherty power amplifier. The Doherty power amplifier includes a peak amplifying branch and a carrier amplifying branch, wherein, the peak amplifying branch includes a radio frequency switch, and the radio frequency switch is configured to control on/off of a last stage peak power amplifier in the peak amplifying branch; wherein, a high voltage heterojunction bipolar transistor (HVHBT) device is adopted for a last stage carrier power amplifier of the carrier amplifying branch, and a laterally diffused metal oxide semiconductor (LDMOS) device is adopted for the last stage peak power amplifier of the peak amplifying branch of the power amplifier. By the present invention, it avoids that the peak power consumption is increased when the peak power amplifier is on ahead of time and enhances the efficiency of the whole power amplifier.

12 Claims, 2 Drawing Sheets

(56) References Cited

U.S. PATENT DOCUMENTS

| | | |
|---|---|---|
| 7,352,239 B2 * | 4/2008 | Lee et al. .................. 330/124 R |
| 7,876,159 B2 * | 1/2011 | Wang et al. .................... 330/295 |
| 8,482,353 B2 * | 7/2013 | Blednov ........................ 330/295 |
| 2006/0119428 A1 | 6/2006 | Lee et al. |

FOREIGN PATENT DOCUMENTS

| | | | |
|---|---|---|---|
| JP | 2006060301 A | | 3/2006 |
| JP | 2010035103 A | | 2/2010 |

OTHER PUBLICATIONS

International Search Report for PCT/CN2011/081383 dated Nov. 21, 2011.

Craig Steinbeiser et al. "Doherty Power Amplifiers using 2nd Generation HVHBT Technology for High Efficiency Basestation Applications"; TriQuint Semiconductor, 500 W, Renner Road, Richardson, Texas 75080 USA; XP 31788359A.

* cited by examiner

DOHERTY POWER AMPLIFIER AND IMPLEMENTATION METHOD THEREOF

TECHNICAL FIELD

The present invention relates to the field of communication technology, and in particular, to a Doherty power amplifier and an implementation method thereof.

BACKGROUND OF THE RELATED ART

As the economic idea of the environmental protection and low carbon is increasingly popular in the world and rooted in the hearts of people, the requirement of reducing the power consumption of the wireless communication system from the operator is higher and higher. In the wireless communication system, the radio frequency power amplifier (abbreviated as power amplifier) in the base station is one of the core modules of the whole system, and the important technical parameter of the radio frequency power amplifier is the efficiency of the power amplifier. The data analysis shows that, in the whole base station, the energy consumption of the power amplifier part occupies about 60% of the whole energy consumption, thereby raising the efficiency of the power amplifier becomes the most effective means of reducing the power consumption of the base station device and reducing the operation expense (OPEX) of the operator. So, in the face of the fierce market competition of the wireless communication day by day, the high-efficiency radio frequency power amplifier technology has already become one of the competitive focuses of the wireless communication industry.

The Doherty power amplifier is a kind of high-efficiency power amplifier technology that is most extensively employed in the wireless communication system at present, and the Doherty power amplifier is invented by an American electronics engineer, named William H. Doherty, in 1936. But in the following about 30 years, the attention of people has been shifted. Until end of the sixties, along with the development of the communication technology, especially the satellite communication, the efficiency and linear question of the power amplifier is proposed in a new historical occasion again, and the Doherty amplifier is excavated out again, which then is widely applied to the communication and broadcast system in the seventies extensively. At present, the Doherty power amplifier and digital pre-distortion (DPD) technology are applied in combination, which has already become the mainstream frame format of the high-efficiency power amplifier of the base station of the wireless communication system.

The basic idea of the Doherty power amplifier is active load pull, and the principle of the traditional Doherty power amplifier is shown in FIG. 1, which mainly includes driver stage amplifiers (Dr1 . . . Drn in the figure), a power splitter (D in the figure), a carrier amplifier (C in the figure, also called as the main power amplifier), a peak amplifier (P in the figure, also called as the auxiliary power amplifier), a power combiner (Combiner in the figure), etc. Wherein, the carrier power amplifier works in class B or class AB, and the peak power amplifier works in class C. The two bear different input signal power respectively, and the two parts of power amplifiers need possible to be made work in their own saturation areas, thereby guaranteeing the whole power amplifier keep higher efficiency in all of the input signal power range as large as possible, and guaranteeing a certain linearity at the same time.

The Doherty power amplifier mainly includes the following three kinds of working states:

a small-signal area, wherein, when the input signal is relatively small, the peak amplifier is in a shutoff state, and the carrier amplifier works in the AB class, at this moment, the carrier amplifier works in the maximum efficiency matching state;

a load modulation area, wherein, when the input signal increases to a certain extent, the carrier amplifier performs the transition from the amplifier area to the saturation area gradually, and the peak amplifier performs the transition from the cut-off area to the amplifier area gradually, at this moment, the load of both the carrier amplifier and the peak amplifier is not stable, and the load impedance varies with the power variation;

a saturation area, wherein, along with the continuous increasing of the input signal, the carrier amplifier and the peak amplifier all work in the saturation state finally, both the two correspond to the load of 50Ω, and the output power is increased.

SUMMARY OF THE INVENTION

The technical problem that the present invention requires to solve is to provide a Doherty power amplifier and an implementation method thereof, which avoids the increasing of the peak power consumption when the peak amplifier is on ahead of time and enhances the efficiency of the whole peak amplifier.

In order to solve the above-mentioned problem, the present invention provides a Doherty power amplifier, wherein, the Doherty power amplifier includes a peak amplifying branch and a carrier amplifying branch, wherein, the peak amplifying branch includes a radio frequency switch, and the radio frequency switch is configured to control on/off of a last stage peak power amplifier in the peak amplifying branch;

wherein, a high voltage heterojunction bipolar transistor (HVHBT) device is adopted for a last stage carrier power amplifier of the carrier amplifying branch, and a laterally diffused metal oxide semiconductor (LDMOS) device is adopted for the last stage peak power amplifier of the peak amplifying branch of the power amplifier.

Preferably, the radio frequency switch includes: a PIN diode radio frequency switch, or a monolithic microwave integrated circuit (MMIC) radio frequency switch.

Preferably, when the peak amplifying branch contains multistage peak power amplifiers, the radio frequency switch is located between a driver stage peak power amplifier and the last stage peak power amplifier.

Preferably, the radio frequency switch is configured to control the on/off of the last stage peak power amplifier in the peak amplifying branch through following way:

when an input signal of the peak amplifying branch increases to a on level of the radio frequency switch, the radio frequency switch is on, which makes the last stage peak power amplifier be conductive.

Preferably, the radio frequency switch further includes a voltage control port, and the on/off level of the radio frequency switch is adjusted through magnitude of control voltage of the voltage control port The present invention further provides a method for implementing a Doherty power amplifier, comprising:

through a radio frequency switch in a peak amplifying branch of the Doherty power amplifier, controlling on/off of a last stage peak power amplifier in the peak amplifying branch;

wherein, a high voltage heterojunction bipolar transistor (HVHBT) device is adopted for a last stage carrier power amplifier of the carrier amplifying branch of the power amplifier, and a laterally diffused metal oxide semiconductor (LDMOS) device is adopted for the last stage peak power amplifier of the peak amplifying branch of the power amplifier.

Preferably, the radio frequency switch includes: a PIN diode radio frequency switch, or a monolithic microwave integrated circuit (MMIC) radio frequency switch.

Preferably, the method further includes:

when the peak amplifying branch contains multistage peak amplifiers, configuring the radio frequency switch located between a driver stage peak power amplifier and the last stage peak power amplifier.

Preferably, the step of controlling on/off of a last stage peak power amplifier in the peak amplifying branch through a radio frequency switch in a peak amplifying branch of the Doherty power amplifier includes:

when an input signal of the peak amplifying branch increases to a on level of the radio frequency switch, the radio frequency switch being on, which makes the last stage peak power amplifier be conductive.

Preferably, the method further includes, adjusting the on/off level of the radio frequency switch through magnitude of control voltage of a voltage control port on the radio frequency switch.

Compared with the related art, the above-mentioned schemes have the following advantages:

a), high efficiency, it avoids the shortcoming that the peak branch in the Doherty power amplifier is conductive ahead of time, reduces the power consumption of the peak power amplifier, and enhances the batch efficiency of the whole power amplifier. In the current Doherty power amplifier, the power consumption of the peak power amplifier generally occupies 10%-20% of the total power consumption of the power amplifier, while after using the above-mentioned scheme, this proportion number can be reduced to 5%-10%; at the same time since the power consumption of the carrier power amplifier occupies the vast majority in the Doherty power amplifier, the carrier power amplifier uses the HVHBT device (the high voltage heterojunction bipolar transistor) device, and the efficiency is far higher than the LDMOS (the laterally diffused metal oxide semiconductor) device, therefore, the efficiency of the whole power amplifier is promoted greatly;

b), low cost, compared with the scheme that some producers improve the on/off time of the peak power amplifier by using complicated digital and radio-frequency circuit, it reduces the product cost and the production cost of the power amplifier greatly; the cost of the last stage amplifying scheme of the HVHBT+LDMOS is much lower when compared with the high efficiency scheme such as, all applies the GaN, etc;

c), small volume, compared with the scheme that some producers improve the on/off time of the peak power amplifier by using complicated digital and radio-frequency circuit, the volume taken is smaller greatly.

BRIEF DESCRIPTION OF DRAWINGS

The accompanying figures explained here are to provide the further understanding to the present invention, which forms a part of the present application. The hinting embodiment and its explanation of the present invention are used for explaining the present invention, and not form the improper limitation of the present invention. In the accompanying figures.

PREFERRED EMBODIMENTS OF THE PRESENT INVENTION

Figure 1:
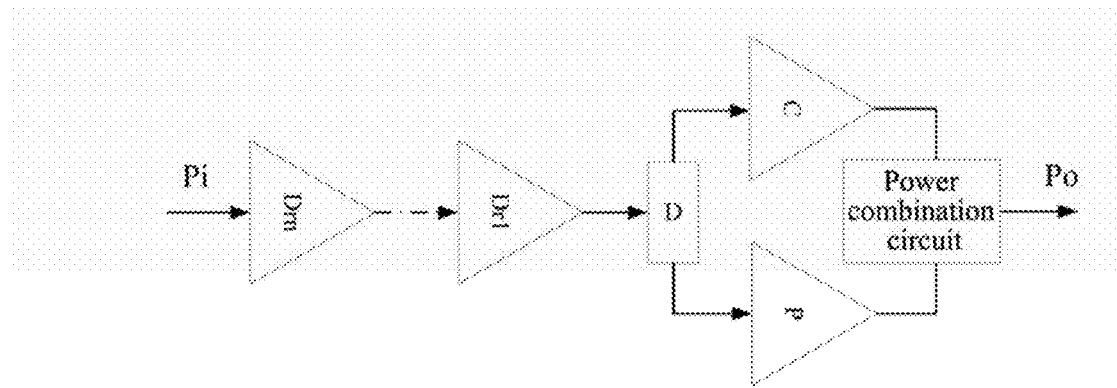
FIG. 1 is a schematic block diagram of a traditional Doherty power amplifier.

The requirement to the communication system of the operator is that the lower the power consumption the better and the higher the efficiency the better. So, we must seek for the method of further reducing the power consumption and promoting the efficiency constantly. And the traditional Doherty power amplifier mainly has the following shortcomings:

1), the power consumption of the peak power amplifier of the Doherty power amplifier is very small in theory, but the power consumption of the peak power amplifier occupies 10%-20% in the real power amplifier. This is because the peak power amplifier works in class C in the Doherty power amplifier, the peak amplifier is not on when the small signal works, when the amplify signal increases from little to a certain extent progressively, the carrier amplifier begins to appear the compression trend, now the peak amplifier must be able to be on and work normally, otherwise it will cause influence on the improvement of the power amplifier linear by the DPD. And the on of the class C amplifier is on gradually along with the signal from small to big, so, in order that the peak amplifier can be totally on when the carrier amplifier begins to compress in real application, it must be made on at a lower level ahead of time, this way, it increases the power consumption of the peak power amplifier, thus reducing the efficiency of the whole power amplifier.

2), what the carrier power amplifier and the peak power amplifier of the current Doherty power amplifier adopt are all laterally diffused metal oxide semiconductor (LDMOS) power amplifier tubes, which have the shortcoming of low work frequency, narrow work width, low efficiency, high power consumption, etc.

In the embodiment of the present invention, the power consumption of the peak amplifying is reduced through controlling the on/off of the signal in the peak amplifying branch of the Doherty power amplifier; meanwhile, through selecting the type of the last stage power amplifier, the efficiency of the whole power amplifier is further promoted.

Specifically, through adding the radio frequency switching circuit in the peak amplifying branch of the Doherty, the radio frequency switch is on when the input signal increases to the appropriate range, and the peak power amplifier is just on, which avoids that the peak power amplifier is on ahead of time, and then reduces the consumption of the peak power amplifier; meanwhile, the last stage amplifier is realized by adopting the combination of the HVHBT and the LDMOS device, to further promote the efficiency of the whole power amplifier. The high voltage heterojunction bipolar transistor (HVHBT) device refers to a heterojunction bipolar transistor (HBT) craft device that can work in the high voltage, which includes but not limited to the Tripower series power amplification device from the Triquint company, U.S.A., and the high voltage refers to the working voltage higher than 12V.

The embodiment of the present invention will be described in detail combining with the accompanying figures hereinafter. It needs to be noted that, in the case of not conflicting, the embodiments in the present application and features in these embodiments can be combined with each other.

Figure 2:
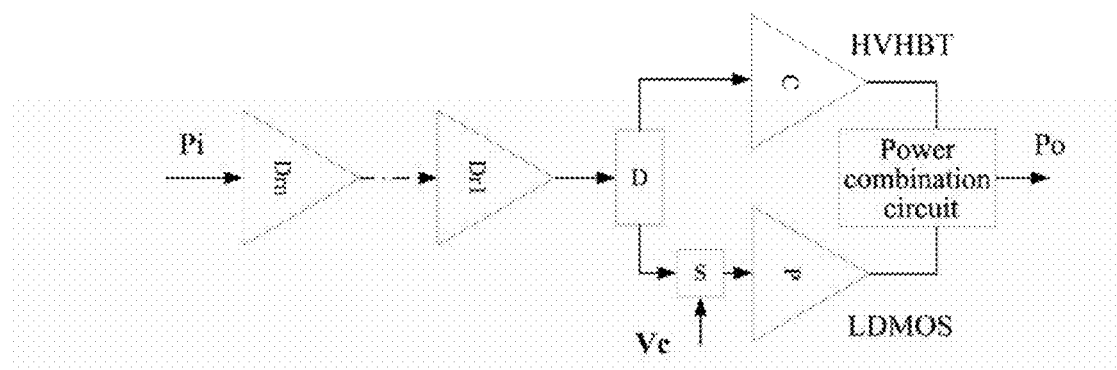
FIG. 2 is a functional block diagram of applying dual path Doherty framework by an embodiment of the present invention.

FIG. 2 shows a block diagram of the embodiment of the present invention applied in dual path Doherty framework. In the picture, Pi is an input signal port; Dr1 . . . Drn are driver stage amplifiers; C is a carrier amplifier, P is a peak amplifier, S is a radio frequency switching circuit, Vc is the control voltage of the radio frequency switch (the on/off level of the radio frequency switch can be adjusted by changing the magnitude of the Vc), D is a power distributor circuit, Combiner is a power combiner, and Po is a signal output port.

Combining with FIG. 2, the procedure of controlling the peak amplifier by the radio frequency switching circuit according to an embodiment of the present invention is described as follows:

when the input signal of the peak amplifying branch is small (less than the on level of the radio frequency switch), the whole peak amplifying branch is in a shutoff state, and now the whole carrier amplifying branch works in the class AB state of maximum efficiency matching.

When the input signal of the peak amplifying branch increases to a certain extent, the carrier amplifying branch begins to perform the transition from the amplifier area to the saturation area gradually, and the peak amplifying branch performs the transition from the cut-off area to the amplifier area, and originally the peak amplifier is not on, and just no power consumption. And when the signal of the input peak branch reaches the on level of the radio frequency switch, the radio frequency switch is on, and thereupon the peak power amplifier is also completely on. This way, it avoids the peak power amplifier to be on ahead of time, reduces the power consumption, and enhances the efficiency of the power amplifier.

In addition, the on/off level of the radio frequency switch can be adjusted by changing the magnitude of Vc, thus meeting the requirements of signal in different systems and different peak amplifier devices.

Finally, along with continues increasing of the input signal, the final whole carrier amplifying branch and the peak amplifying branch all works in the saturation state.

Figure 3:
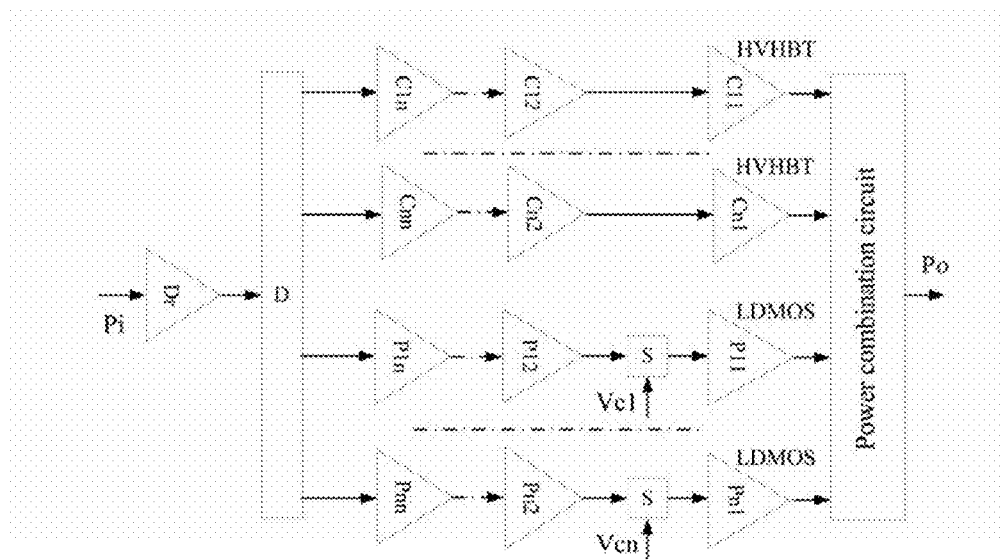
FIG. 3 is a functional block diagram of applying multipath Doherty framework by an embodiment of the present invention.
Figure 4:
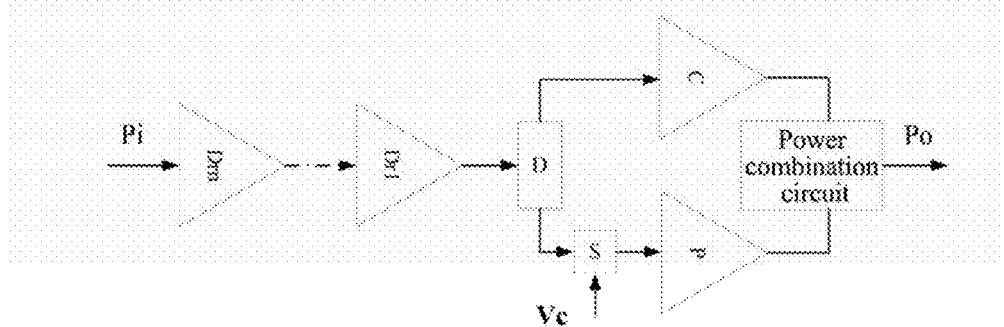
FIG. 4 is a functional block diagram of applying UMTS 2.1 GHz frequency band and 85 W power amplifier by an application example of the present invention.

The schematic diagram of applying the multipath and multistage Doherty power amplifier framework according to am embodiment of the present invention is shown in FIG. 3. In the figure, Pi is the input signal port; Dr is a driver stage amplifier; D is the power splitter; C11 . . . C1n to Cn1 . . . Cnn form the first to the $n^{th}$ carrier amplifying branch of the multistage Doherty power amplifier; P11 . . . P1n to Pn1 . . . Pnn form the first to the $n^{th}$ peak amplifying branch of the multistage Doherty power amplifier; S1 . . . Sn are the radio frequency switching circuits of the first to the $n^{th}$ peak amplifying branch, Vc1 . . . Vcn are the control voltages of the corresponding radio frequency switch (the break level of the corresponding radio frequency switch can be adjusted by changing the magnitude of Vc1 . . . Vcn); and Combiner is the power combiner. The principle of its characteristic improvement is similar to the dual path Doherty power amplifier framework.

In addition, the embodiment of the present invention also provides a method for realizing the method of controlling the on/off of the peak amplifier by the radio frequency switch and a design method of the Doherty power amplifier. For example, the main technical requirements of some UMTS power amplifier are as follows: the frequency range is 2110 MHz-2170 MHz, the output power is 85 W, the input signal PAR is 7 dB, the gain is 50 dB, the efficiency is 42%, and the linear parameter (including ACPR, SEM, Out of Band Spurious, etc.) meets the requirement of the standard protocol.

Specifically, the process of finishing the research and development of the whole power amplifier by applying the embodiment of the present invention mainly includes the following steps.

In step A, the framework form of the power amplifier is confirmed. Since the output power of the power amplifier is 85 W and the efficiency is required to be more than 42%, comprehensively considering the power amplifier technical parameter requirement and the current device condition, it is determined that the whole power amplifier adopts dual path Doherty framework form (such as the framework in accompanying FIG. 2).

In step B, the power amplifier device types of the last stage carrier amplifier (C1) and the last stage peak amplifier (P1) are selected. According to the requirement of the output power and the input signal PAR, the HVHBT power amplifier tube TG2H214120 of the Triquint is selected as the last stage carrier amplifying device, and the LDMOS power amplifier tube BLF7G20LS-200 of the NXP company is selected as the last stage peak amplifying device. Since the power consumption of the carrier power amplifier occupies the majority in the Doherty power amplifier, and the carrier power amplifier in the present invention adopts the HVHBT power amplifier device, it enhances the efficiency greatly compared with the LDMOS device, and the efficiency of the whole power amplifier gets promotion greatly.

In the embodiment of the present invention, the improvement is performed mainly aiming at the last stage carrier power amplifier and the last stage peak power amplifier, and when the carrier amplifying branch includes the multistage carrier power amplifiers, the HVHBT power amplifier tube can be adopted for the driver stage carrier power amplifier, and also the LDMOS power amplifier tube can be adopted.

In step C, the driver stage device is selected. In the present example, considering all around requirements, the MRF21060 of the Freescale company is selected and regarded as the driver stage device, and the SXA-389Z of the RFMD company is selected and regarded as the first stage driver amplifying device.

In step D, the radio frequency switch design of the peak amplifying branch is finished. The realization of this radio frequency switch includes various forms such as the PIN diode radio frequency switch, monolithic microwave integrated amplifier (MMIC) radio frequency switch, etc., and the radio frequency switch needs to be able to on/off fast.

In step E, Other circuit design, such as temperature compensation, circulator, coupler, etc., the schematic diagram and PCB design of the final whole power amplifier are finished.

In step F, Debugging and test of the whole power amplifier are finished.

The above description is only the preferred embodiments of the present invention and is not intended to limit the scope of the present invention. The present invention can have a variety of other embodiments. Those skilled in the art can make the corresponding modifications and variations according to technical scheme and the conception of the present invention without departing from the spirit and essence of the present invention. And all of these modifications or the variations should be embodied in the scope of the appending claims of the present invention.

Obviously, it can be understood by those skilled in the art that each module or each step above-mentioned in the present invention can be implemented by the universal calculating apparatus, and they can be integrated in a single calculating apparatus, or distributed in the network made up by a plurality of calculating apparatus. Alternatively, they can be implemented by the executable program codes of the calculating apparatus. Accordingly, they can be stored in the storage apparatus and implemented by the calculating apparatus, and in some cases, the shown or described steps can be executed according to the order different here, or they are made to each integrated circuit module respectively, or a plurality of modules or steps therein are made into the single integrated circuit module to be implemented. This way, the present invention is not limit to any specific form of the combination of the hardware and software.

INDUSTRIAL APPLICABILITY

The above-mentioned embodiment has the following advantages:

a), high efficiency, it avoids the shortcoming that the peak branch in the Doherty power amplifier is conductive ahead of time, reduces the power consumption of the peak power amplifier, and enhances the batch efficiency of the whole power amplifier. In the current Doherty power amplifier, the power consumption of the peak power amplifier generally occupies 10%-20% of the total power consumption of the power amplifier, while after using the above-mentioned scheme, this proportion number can be reduced to 5%-10%; at the same time since the power consumption of the carrier power amplifier occupies the vast majority in the Doherty power amplifier, the carrier power amplifier uses the HVHBT device (the high voltage heterojunction bipolar transistor) device, and the efficiency is far higher than the LDMOS (the laterally diffused metal oxide semiconductor) device, therefore, the efficiency of the whole power amplifier is promoted greatly;

b), low cost, compared with the scheme that some producers improve the on/off time of the peak power amplifier by using complicated digital and radio-frequency circuit, it reduces the product cost and the production cost of the power amplifier greatly; the cost of the last stage amplifying scheme of the HVHBT+LDMOS is much lower when compared with the high efficiency scheme such as, all applies the GaN, etc;

c), small volume, compared with the scheme that some producers improve the on/off time of the peak power amplifier by using complicated digital and radio-frequency circuit, the volume taken is smaller greatly.

What we claim is:

1. A Doherty power amplifier, including a peak amplifying branch and a carrier amplifying branch, wherein, the peak amplifying branch includes a radio frequency switch, and the radio frequency switch is configured to control on/off of a last stage peak power amplifier in the peak amplifying branch;
wherein, a high voltage heterojunction bipolar transistor (HVHBT) device is adopted for a last stage carrier power amplifier of the carrier amplifying branch, and a laterally diffused metal oxide semiconductor (LDMOS) device is adopted for the last stage peak power amplifier of the peak amplifying branch of the power amplifier;
wherein,
when the peak amplifying branch contains multistage peak power amplifiers, the radio frequency switch is located between a driver stage peak power amplifier and the last stage peak power amplifier.

2. The power amplifier according to claim 1, wherein, the radio frequency switch includes: a PIN diode radio frequency switch, or a monolithic microwave integrated circuit (MMIC) radio frequency switch.

3. The power amplifier according to claim 1, wherein, the radio frequency switch is configured to control the on/off of the last stage peak power amplifier in the peak amplifying branch through following way:
when an input signal of the peak amplifying branch increases to a on level of the radio frequency switch, the radio frequency switch is on, which makes the last stage peak power amplifier be conductive.

4. The power amplifier according to claim 3, wherein, the radio frequency switch further includes a voltage control port, and the on/off level of the radio frequency switch is adjusted through magnitude of control voltage of the voltage control port.

5. A method for implementing a Doherty power amplifier, including:
through a radio frequency switch in a peak amplifying branch of the Doherty power amplifier, controlling on/off of a last stage peak power amplifier in the peak amplifying branch;
when the peak amplifying branch contains multistage peak amplifiers, configuring the radio frequency switch located between a driver stage peak power amplifier and the last stage peak power amplifier;
wherein, a high voltage heterojunction bipolar transistor (HVHBT) device is adopted for a last stage carrier power amplifier of the carrier amplifying branch of the power amplifier, and a laterally diffused metal oxide semiconductor (LDMOS) device is adopted for the last stage peak power amplifier of the peak amplifying branch of the power amplifier.

6. The method according to claim 5, wherein, the radio frequency switch includes: a PIN diode radio frequency switch, or a monolithic microwave integrated circuit (MMIC) radio frequency switch.

7. The method according to claim 5, wherein, the step of controlling on/off of a last stage peak power amplifier in the peak amplifying branch through a radio frequency switch in a peak amplifying branch of the Doherty power amplifier includes:
when an input signal of the peak amplifying branch increases to a on level of the radio frequency switch, the radio frequency switch being on, which makes the last stage peak power amplifier be conductive.

8. The method according to claim 7, further including, adjusting the on/off level of the radio frequency switch through magnitude of control voltage of a voltage control port on the radio frequency switch.

9. The power amplifier according to claim 2, wherein, the radio frequency switch is configured to control the on/off of the last stage peak power amplifier in the peak amplifying branch through following way:
when an input signal of the peak amplifying branch increases to a on level of the radio frequency switch, the radio frequency switch is on, which makes the last stage peak power amplifier be conductive.

10. The power amplifier according to claim 9, wherein, the radio frequency switch further includes a voltage control port, and the on/off level of the radio frequency switch is adjusted through magnitude of control voltage of the voltage control port.

11. The method according to claim 6, wherein, the step of controlling on/off of a last stage peak power amplifier in the peak amplifying branch through a radio frequency switch in a peak amplifying branch of the Doherty power amplifier includes:
when an input signal of the peak amplifying branch increases to a on level of the radio frequency switch, the radio frequency switch being on, which makes the last stage peak power amplifier be conductive.

12. The method according to claim 11, further including, adjusting the on/off level of the radio frequency switch through magnitude of control voltage of a voltage control port on the radio frequency switch.

* * * * *